United States Patent
Shrivastava et al.

(10) Patent No.: US 6,392,267 B1
(45) Date of Patent: *May 21, 2002

(54) FLASH EPROM ARRAY WITH SELF-ALIGNED SOURCE CONTACTS AND PROGRAMMABLE SECTOR ERASE ARCHITECTURE

(75) Inventors: Ritu Shrivastava, Fremont; Chitranjan N. Reddy, Los Altos Hills, both of CA (US)

(73) Assignee: Alliance Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,752

(22) Filed: Apr. 25, 1997

(51) Int. Cl.$^7$ ............................................ H01L 29/788
(52) U.S. Cl. ........................................ 257/316; 257/322
(58) Field of Search ................................ 257/316, 321, 257/322

(56) References Cited

U.S. PATENT DOCUMENTS

| | | | |
|---|---|---|---|
| 4,804,637 A | 2/1989 | Smayling et al. | 437/52 |
| 4,868,619 A | 9/1989 | Mukherjee et al. | 365/185 |
| 5,077,691 A | 12/1991 | Haddad et al. | 365/218 |
| 5,262,662 A | 11/1993 | Gonzalez et al. | 257/307 |
| 5,270,240 A | * 12/1993 | Lee | 437/52 |
| 5,292,681 A | 3/1994 | Lee et al. | 437/48 |
| 5,343,063 A | 8/1994 | Yuan et al. | 257/317 |
| 5,518,942 A | * 5/1996 | Shrivastava | 437/43 |
| 5,552,331 A | 9/1996 | Hsu et al. | 437/40 |
| 5,553,018 A | 9/1996 | Wang et al. | 365/185.01 |
| 5,700,706 A | * 12/1997 | Juengling | 437/52 |
| 5,814,862 A | * 9/1998 | Sung et al. | 257/344 |
| 5,923,585 A | * 7/1999 | Wong et al. | 365/185.03 |

OTHER PUBLICATIONS

Horiba et al., "A Symmetric Diagonal Driver Transistor SRAM Cell with Imbalance Suppression Technology for Stable Low Voltage Operation", IEEE Symposium on VLSI Technology 1996, pp. 144–145.

Ohshima et al., "Process and Device Technologies For 16Mbit EPROMs With Large–Tilt–Angle Implanted P–pocket Cell", *IEDM 1990*, pp. 5.2.1–5.2.4.

* cited by examiner

*Primary Examiner*—Sara Crane
(74) *Attorney, Agent, or Firm*—Stallman & Pollock LLP

(57) ABSTRACT

A flash EPROM array (100) and method of manufacture is disclosed. Source regions (118*a*–118*f*) are shared between the memory cells (108*a,1*–108*d,n*) of row (104*a*–104*d*) pairs, and are isolated from one another in the row direction by isolation regions 120. Low resistance source conductor members (122*a*–122*b*) extend in the row direction and are formed over the source regions (118*a*–118*f*) and make contact therewith in a self-aligned fashion. The architecture allows for source decoding and thus enables user programmable sector erase architecture.

26 Claims, 19 Drawing Sheets

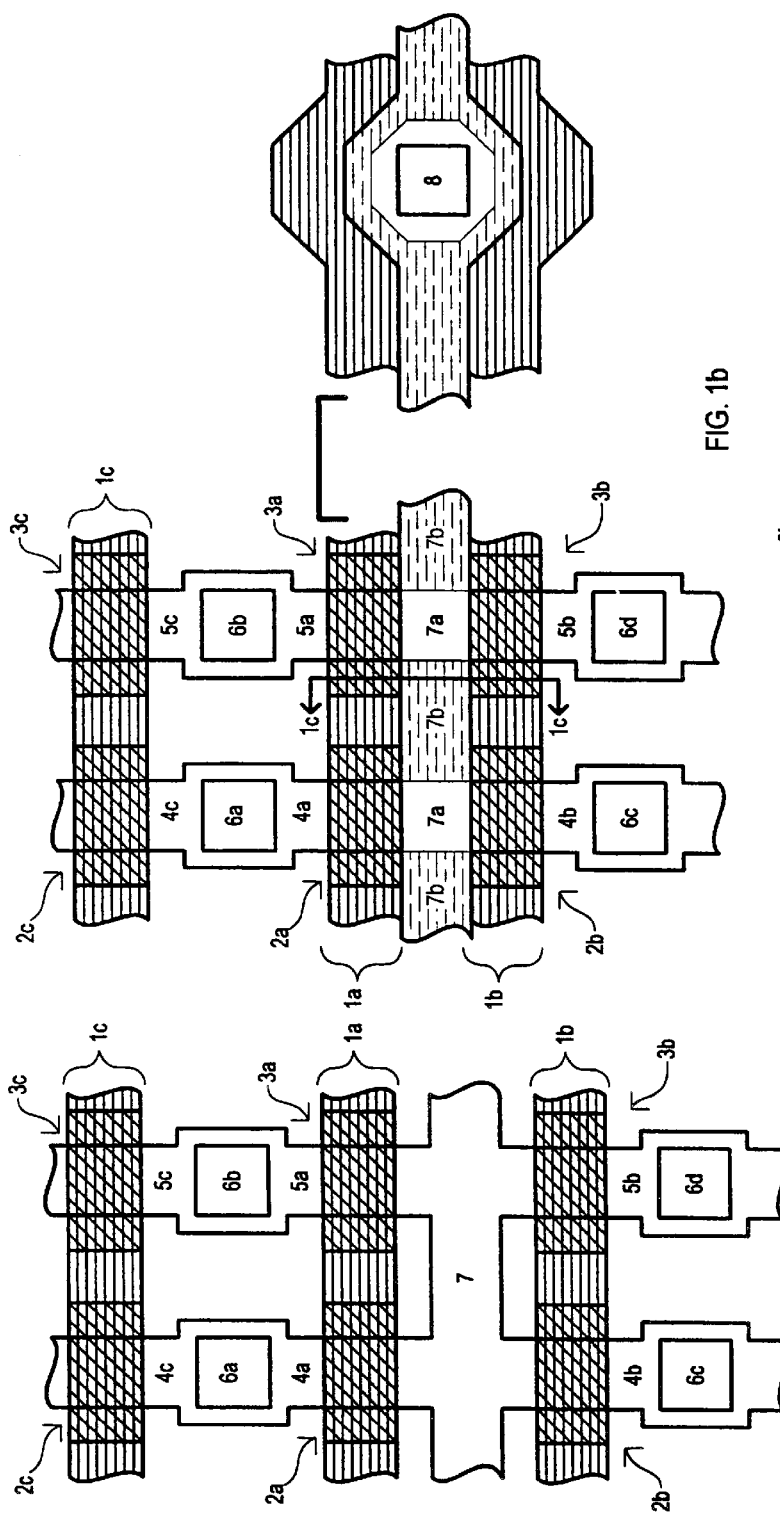
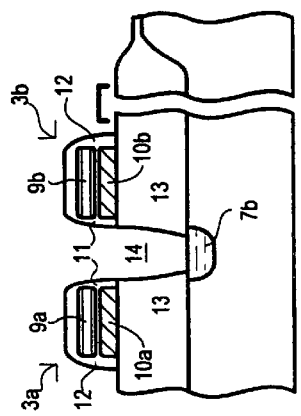
FIG. 1a
FIG. 1b
FIG. 1c

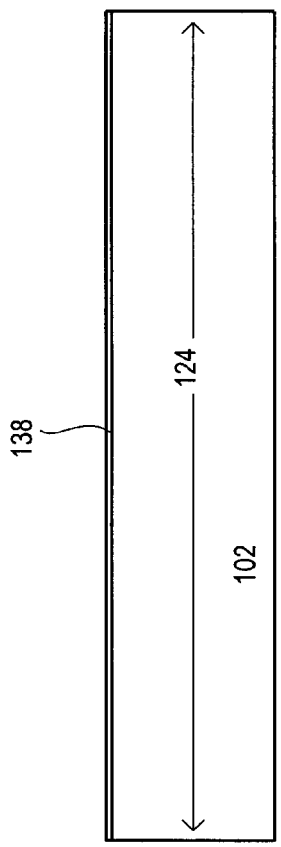
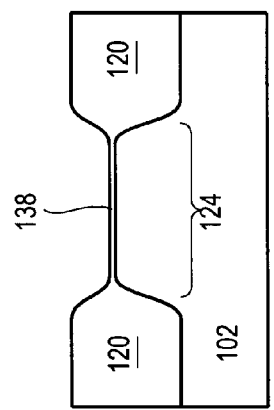
FIG. 3c
FIG. 3b

FLASH EPROM ARRAY WITH SELF-ALIGNED SOURCE CONTACTS AND PROGRAMMABLE SECTOR ERASE ARCHITECTURE

TECHNICAL FIELD

The present invention relates generally to nonvolatile memory integrated circuits and more particularly to flash EPROM arrays.

BACKGROUND OF THE INVENTION

Nonvolatile memory integrated circuits typically include memory cells arranged in one or more arrays. A common type of nonvolatile memory integrated circuit is an electrically programmable read-only-memory (EPROM). The memory cells of EPROMs commonly utilize floating gate structures which can store charge, and thereby indicate a certain logic state. Electrically programmable ROMs include UVPROMs in which the cells are programmed by hot electron injection or tunneling, and erased by the application of ultra-violet light; EEPROMS in which the cells are programmed and erased by tunneling; and "flash" EPROMs in which the cells are programmed by hot electron injection or tunneling, and groups of cells are simultaneously erased by tunneling.

The reading, programming, and erasing of EPROM memory cells requires the application of certain voltages to each cell. For example, in U.S. Pat. No. 4,698,787 issued to Mukherjee et al. on Oct. 6, 1987, a flash EPROM is disclosed having one transistor ("1-T") cells where the cells are read by grounding the sources of the cells, applying a positive voltage to the gate, and sensing the resulting potential at the drain. The cells of Mukherjee et al. are programmed by grounding the sources of the cells, and applying a positive gate and drain voltage. Erasure of the cells of Mukherjee et al. is accomplished by floating the drains of a group of cells and placing the sources of the cells in the group at a higher potential than their respective gates. In Mukherjee et al., because the memory cells are flash erased, there is no need to differentiate source connections. As a result, a common source diffusion is utilized. The use of a common source diffusion leads to a compact array design.

The use of a common source diffusion can give rise to a number of limitations in the implementation of a flash EPROM. For example, when a selected cell coupled to the common source diffusion is programmed, the inherent resistance of the diffused region can result in the poor programming of selected cells, due to the source potential generated by the programming current. Accordingly, the size of common source regions in flash EPROM are limited to minimize common source resistance. In addition, in the case where the erase voltage between the control gate and the source is accomplished by placing the sources at a higher potential with respect to the gate and also with respect to the substrate, substrate junction leakage can result. Such junction leakage can result in source current which can affect erase speed due to source voltage drop. Alternately, a process requiring a higher source breakdown voltage may be needed. For example, Mukherjee et al. employs a double diffused source region to increase the source breakdown voltage. U.S. Pat. No. 4,742,492 issued to Smayling et al. on May, 3 1988, and U.S. Pat. No. 5,077,691 issued Haddad et al. on Dec. 31, 1991 disclose the use of a negative word line erase potential in conjunction with a relatively low positive common source voltage to limit the substrate-to-source potential during erase.

Yet another issue raised by diffused common source regions is the array area required for such approaches. Referring now to FIG. 1a, a portion of a prior art flash EPROM array is set forth in a top plan view. The portion of the array set forth includes three rows of cells, shown as items 1a–1c. Each row of cells includes memory cells 2a–2c and 3a–3c. Each memory cell includes a floating gate (indicated by diagonal hatching), a control gate formed over the floating gates of each row (indicated by horizontal hatching), and source and drain regions separated by channel regions. The drain regions are designated as 4a–4c and 5a–5c. Bit line contacts 6a–6d are provided for coupling the drain regions of the memory cells to bit lines (not shown). Each bit line contact 6a–6d is shared by two memory cells from different rows. Memory cells 2a, 2b, 3a and 3b share a common source region 7 that extends in the row direction. In the arrangement of FIG. 1a, the common source region 7 is formed as part of an active region separated by isolation regions. The active regions are created prior to the formation of the control gate of the memory cells 2a–2c and 3a–3c. As a result, in order to ensure that misalignments inherent in the fabrication process will not create memory cells having control gates that overlap the source region, the control gates must be formed at a minimum distance away from source region. The minimal spacing requirement results in larger arrays.

In the previous art, all the source contacts are tied together because of the need to minimize source resistance. Erase voltages are typically supplied to the common sources by a "strapping" interconnect, such as metal. This type of arrangement does not allow smaller portions of the array to be erased at will, and results in arrays having minimum, predetermined erasable portions ("granularity"). FIG. 1b sets forth a prior art approach to eliminating the source spacing requirement by fabricating a "self-aligned" common source region. FIG. 1b has many of the same features of FIG. 1a, and so like elements will be referred to by the same reference character. The self-aligned common source of FIG. 1b differs from the arrangement of FIG. 1a in that the source regions include active area source regions 7a and etched source regions 7b. As in the case of the FIG. 1a, architecture the active area source regions 7a are formed prior to the control gates of the memory array. Unlike FIG. 1a, the etched source regions 7b are created after the floating gate and control gate are formed, by etching through field oxide regions and implanting dopants into the exposed etched source region to increase the conductivity of the source. While allowing memory cells to be placed closer to the source region, the self-aligned common source region approach, such as that set forth in FIG. 1b, includes some drawbacks. Despite the implantation step, the resulting resistance of the common source introduces a limit to the number of memory cells that may be coupled to the common source before periodic contacts using a low resistance interconnect such as metal must be made to the source region. A periodic contact 8 for the common source region is set forth in the FIG. 1b arrangement. As shown in the figure, the periodic contact requires its own active area and so disturbs the pitch of the memory cells, reducing the compactness of the resulting array. Another issue raised by the self-aligned common source region such as that set forth in FIG. 1b, is illustrated by FIG. 1c. FIG. 1c is a side cross sectional view taken along line c—c in FIG. 1b. FIG. 1c sets forth portions of memory cells 3a and 3b, which both include control gates (word lines) 9a and 9b, and floating gates 10a and 10b. The control gates and floating gates are protected on their side surfaces by a source sidewall spacers 11 and drain sidewall spacers 12. The memory cells (3a and 3b) along line c—c sit on a insulation area formed from field oxide 13. In order to form the etched source region 7b, a trench 14 must be etched through the field oxide 13 in a self-aligned source etch step. The action of etching through the field oxide 13 results in some etching of the source sidewall spacers 11, which can lead to charge leakage in the memory cell, impacting the reliability of the memory device.

It would be desirable to arrive at an EPROM array without the drawbacks of prior art approaches.

SUMMARY OF THE INVENTION

It is an object of the present invention to provide a non-volatile memory cell array having a reduced area by eliminating the need of source "strapping".

It is another object of the present invention to provide a non-volatile memory cell array having flexible, user programmable common source blocks or sectors.

It is another object of the present invention to provide a flash EPROM device wherein parts of the array can be selectively erased by choosing source interconnect lines.

It is another object of the present invention to provide an improved "page erase" architecture.

It is another object of the present invention to provide a user programmable sector erase architecture.

It is another object of the present invention to provide a non-volatile memory cell array having a low resistance common source arrangement.

It is another object of the present invention to increase the number of non-volatile memory cells that can have common source connections in an array.

It is another object of the present invention to improve the uniformity of programming and erase speeds in a flash EPROM.

It is another object of the present invention to improve cell endurance of flash EPROM devices.

It is another object of the present invention to provide a flash EPROM having improved low supply voltage operation.

It is another object of the present invention to reduce cell current programming and erase variations.

It is another object of the present invention to reduce the number of source contacts required in a non-volatile memory array.

It is another object of the present invention to improve the reliability of flash EPROMs by eliminating the need for a self-aligned source etch step.

The present invention includes a non-volatile memory cell array where each memory cell has a source region. An inter-layer dielectric is formed over the memory cells and the source regions. A self-aligned contact etch is applied to expose the source regions. The source regions are then commonly connected by a conductive layer formed over the exposed source regions.

According to one aspect of the present invention, the memory cells are formed from polycrystalline silicon (polysilicon) layers, and the conductive layer connecting the source regions is formed from polysilicon.

According to another aspect of the present invention, the source region of one memory cell in one row is shared by the source region of another memory cell in an adjacent row.

According to another aspect of the invention, the etch mask used to expose the source regions has an opening that extends along the row of the array.

According to another aspect of the invention, the etch mask used to expose the source regions has an opening corresponding to each source region that is to be exposed.

An advantage of the present invention is that it improves programming in a flash EPROM by reducing voltage drop on the source lines.

Another advantage of the present invention is that it provides a more scalable technology by using a polysilicon layer to interconnect source regions, rather than metal contacts. Metal contacts can give rise to processing problems due to the high aspect ratios of such metal contacts.

Another advantage of the present invention is that it provides a flash EPROM having a more flexible architecture.

Other objects and advantages of the present invention will become apparent in light of the following description thereof.

BRIEF DESCRIPTION OF THE DRAWINGS

FIGS. 1a–1c illustrate flash EPROM arrays according to the prior art.

FIGS. 3a–3c through FIGS. 9a–9c illustrate a process for fabricating a flash EPROM array according to the present invention.

DETAILED DESCRIPTION OF THE EMBODIMENTS

Figure 2A:
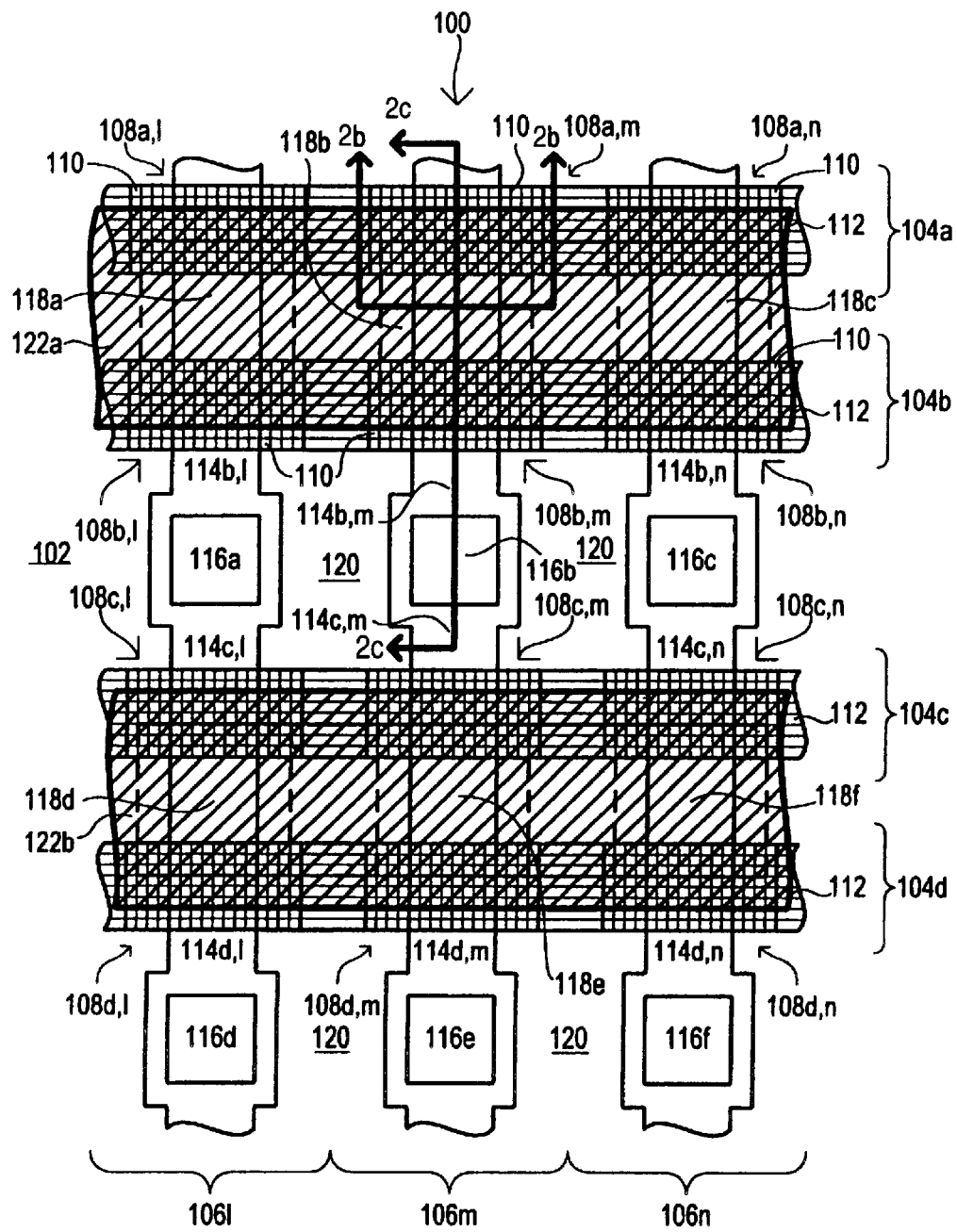
FIGS. 2a–2c set forth a flash EPROM array according to a preferred embodiment of the present invention.
Figure 2C:
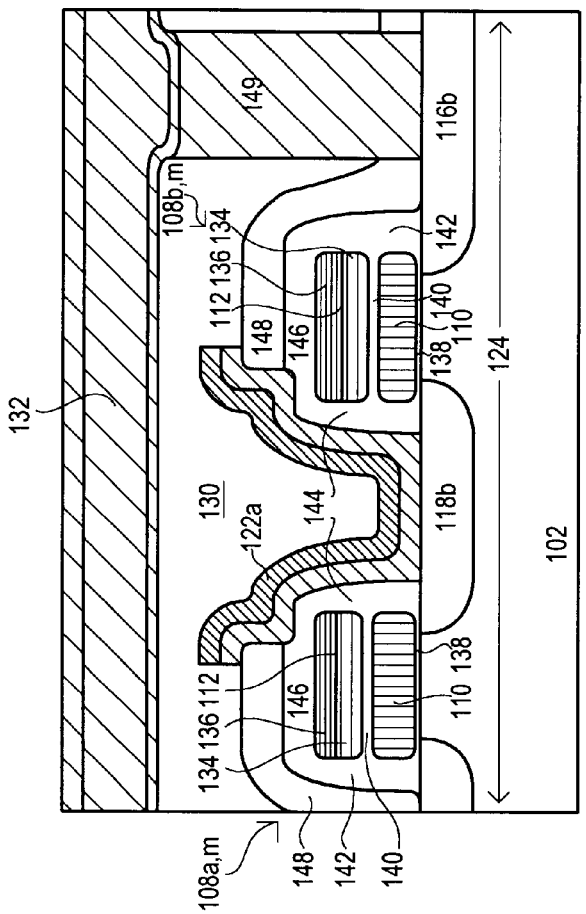
Figure 2B:
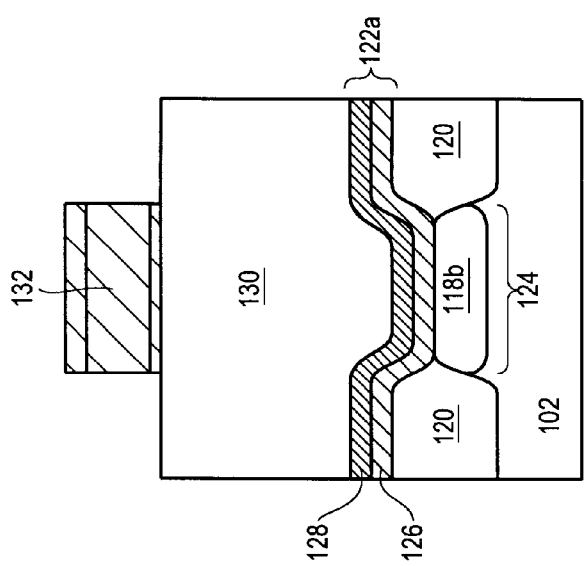

The preferred embodiment of the present invention is a flash EPROM array having a plurality of one transistor (1-T) stacked gate non-volatile memory cells arranged in rows and columns. A portion of an array according to the preferred embodiment is set forth generally, in FIGS. 2a–2c. FIG. 2a is a top plan view. FIG. 2b is a side cross sectional view taken along line b—b of FIG. 2a (the row direction). FIG. 2c is a side cross sectional view taken along line c—c of FIG. 2a (the column direction). The array is designated by the general reference character 100 and is formed on a semiconductor substrate 102. The portion of the array 100 set forth includes four rows designated as 104a–104d, and three columns, shown as 106l–106n. The portion of the array 100 set forth in FIG. 2a includes twelve memory cells (108a,l–108d,n) identified according to their column and row location.

Each of the memory cells (108a,l–108d,n) includes a floating gate 110 (indicated by vertical hatching) and a control gate. The control gates of the memory cells in the same row (104a–104d) are formed as integral portions of a wordline 112 (indicated by horizontal hatching) that extends along each row (104a–104d). Each memory cell (108a, l–108d,n) also includes a drain region (114b,l–114d,n) and a source region. In the preferred embodiment, the drain regions (114b,l–114d,n) of the memory cells in different rows are coupled to bit line contacts 116a–116f. For example, in FIG. 2a, drains 114b,l and 114c,l are coupled to the bit line contact 116a.

The memory cell source arrangement of the preferred embodiment, includes source regions 118a–118f that are shared between cells in adjacent rows. For example, in FIG. 2a, source region 118a is shared between memory cells 108a,1 and 108b,1. Unlike the prior art, the source regions of memory cells in adjacent columns remain isolated, on the substrate level, by isolation regions. As set forth in FIG. 2a, source region 118b is separated from source regions 118a and 118c by isolation regions 120. Although isolated from one another on the substrate level, the source regions 118a–118f are commonly connected by low resistance source conductor members 122a–122b (indicated by diagonal hatching) formed after the memory cells (108a,1–108d, n). The source conductor members 122a–122b of the preferred embodiment, extend along row pairs, partially overlapping the memory cells of their respective rows. As set forth in FIG. 2a, source conductor member 122a extends along rows 104a and 104b, while source conductor member 122b extends along rows 104c and 104d.

It is noted that the bit lines are excluded from the view of FIG. 2a for clarity. In the preferred embodiments, a bit line is associated with each column, and extends in the column direction, perpendicular to the wordlines, over the memory cells and source conductor members. Each bit line makes contact with the drains of the memory cells of its associated column.

Referring now to FIG. 2b, a side cross sectional view of source region 118b taken along the row direction, is set forth in detail. The source region 118b is shown formed in an active area 124 of the substrate 102, and isolated on both sides by isolation regions 120. Along the direction of the FIG. 2b, the source conductor member 122a is shown to be formed on the isolation regions 120 and extend down to the active area 124 to make contact with the source region 118b. In the preferred embodiment, the source conductor members are formed from a third layer of polycrystalline silicon (poly 3) 126 and a layer of silicide 128. An inter-layer dielectric (ILD 2) 130 is formed over the source conductor member 118b. Unlike FIG. 2a, a bit line 132 is shown in FIG. 2b, formed on the ILD 2 130, running in the column direction.

Referring now to FIG. 2c, a side cross sectional view is set forth, taken along the line c—c of FIG. 2a, through memory cells 108a,m and 108b,m. The memory cells 108a,m and 108b,m are shown formed on an active area 124 of the substrate 102, sharing source region 118b. Each memory cell includes a wordline (control gate) 112 and a floating gate 110. The floating gate is formed from polysilicon (poly 1) and the wordlines, like the source conductor members, are formed from a layer of polysilicon (poly 2) 134 and a layer of silicide 136. The floating gates 110 are insulated from the active area 124 by tunnel dielectric 138, and from their respective wordlines 112 by a cell interlayer (interpoly) dielectric 140. The sides of the floating gate/control gate pairs are insulated by drain sidewall spacers 142 and source sidewall spacers 144. The top of the control gates 112 are insulated by a "cap" insulator 146.

Referring once again to FIG. 2c, in the preferred embodiment, the source conductor member 122a is disposed over both memory cells (108a,m and 108b,m), and extends downward, along the source sidewall spacers 144 to make contact with source region 118b. The source sidewall spacers 144 and cap insulators 146 are formed from an insulating material, and insulate the wordlines 112 and control gates 110 of the memory cells (108a,m and 108b,m). It is noted that unlike the self-aligned common source arrangement of FIGS. 1b and 1c, which etches through the field oxide regions to expose the substrate in forming a common source, the preferred embodiment only clears each source region (118a–118f) in the active areas, resulting in far less thinning of the source sidewall spacers 144 and interlayer dielectric 140, for more reliable memory cells. A portion of the source conductor member 122a is disposed on a first inter-layer dielectric (ILD 1) 148. The ILD 2 130 is shown formed over the source conductor member 122a and the ILD 1 148. As in the case of FIG. 2b, the bit line 132 is formed on the ILD 2 130. In the preferred embodiment, the bit line 132 includes a plug member 149 that provides reliable electrical contact to the drain region 116b.

Figure 10:
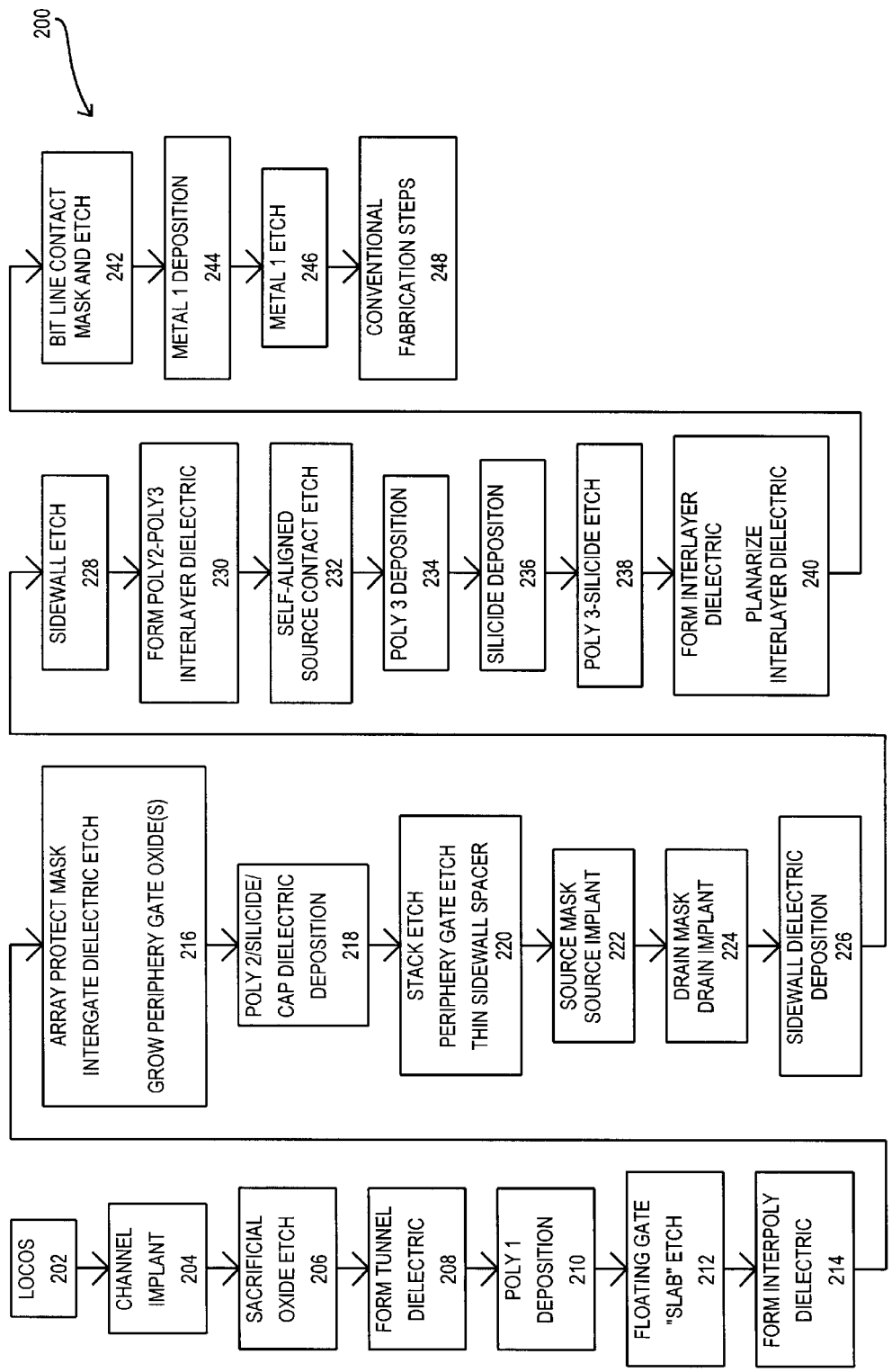
FIG. 10 is a flow diagram illustrating a method of fabricating a flash EPROM array according to the present invention.

Referring now to FIGS. 3a–3c through FIGS. 9a–9c in conjunction with FIG. 10, a series of plan views, side cross sectional views, and a flow chart are set forth, illustrating the fabrication of a flash EPROM array according to a preferred embodiment of the present invention.

Figure 3A:
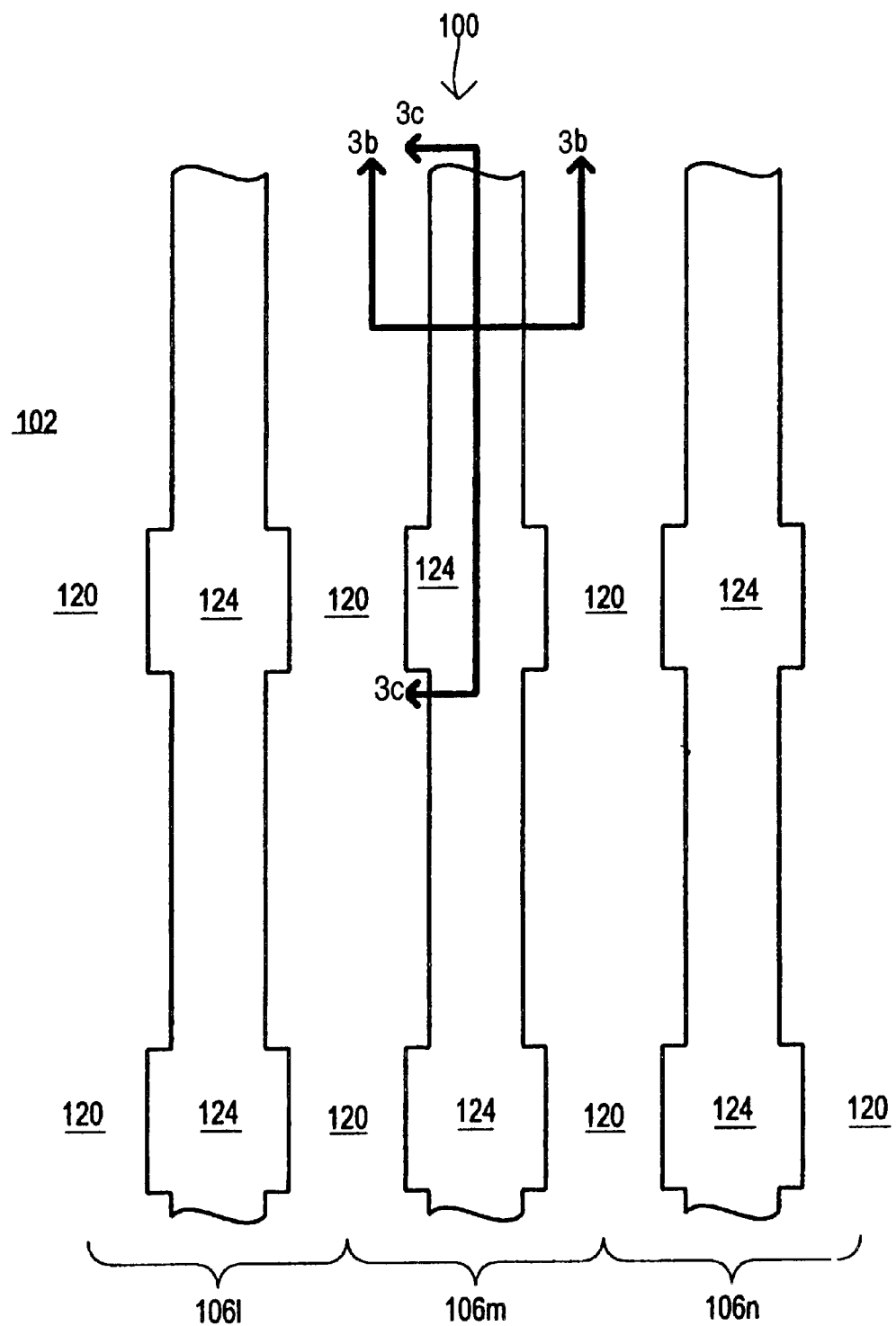

The plan view and side cross sectional views correspond to those set forth in FIGS. 2a–2c. Those figures having numbers followed by the letter "a" (e.g., FIGS. 3a, 4a, 5a . . . ) are the same top plan view taken at various stages in the process set forth in FIG. 10. In the same manner, those figures having numbers followed by the letters "b" and "c" (e.g., FIGS. 3b, 4b, 5b . . . FIGS. 3c, 4c, 5c . . . ) are side cross sectional views taken along the same lines b—b and c—c at various stages in the process.

Referring now to FIG. 10 in conjunction with FIGS. 3a–3c, the process 200 begins with an isolation process such as a LOCOS step 202. Isolation regions 120 of field oxide are formed in the substrate 102 separated by active areas 124. Notably, unlike the diffused source case in FIG. 1a, there is no active area running horizontally, connecting vertically disposed active areas.

Following the isolation 202 and channel implant 204 steps, the sacrificial oxide (which is disposed over the active areas 124) is etched away (step 206) to create a cleaned active area 124. In the preferred embodiment, the sacrificial oxide etch is a wet chemical etch of dilute hydrofluoric acid (HF). In step 206, and as shown in FIGS. 3a–3c, the tunnel dielectric 138 is grown on the active area 124. In the preferred embodiment, the tunnel oxide is thermally grown for a thickness in the approximate range of 80–100 Å.

Figure 4A:
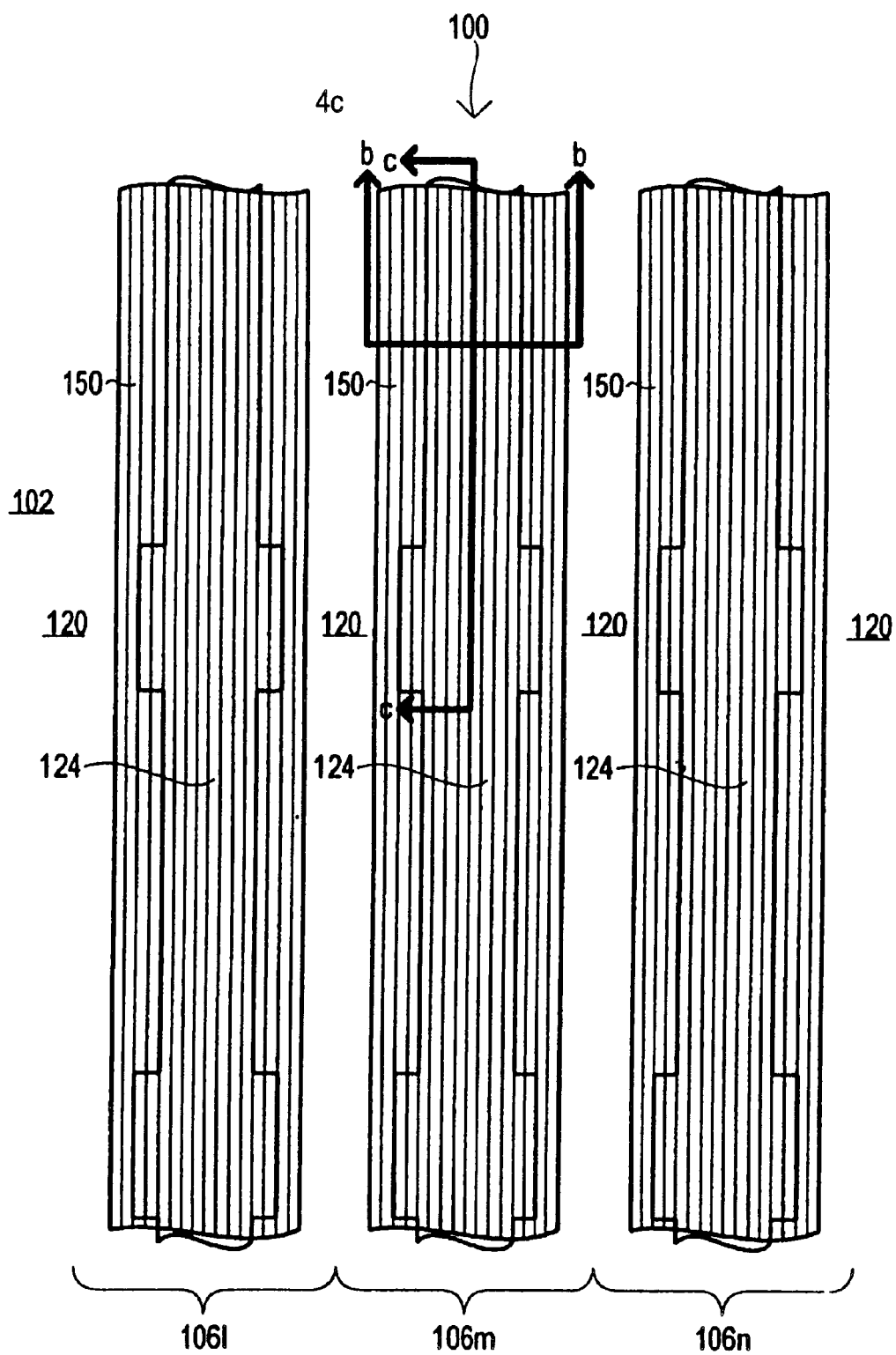
Figure 4C:
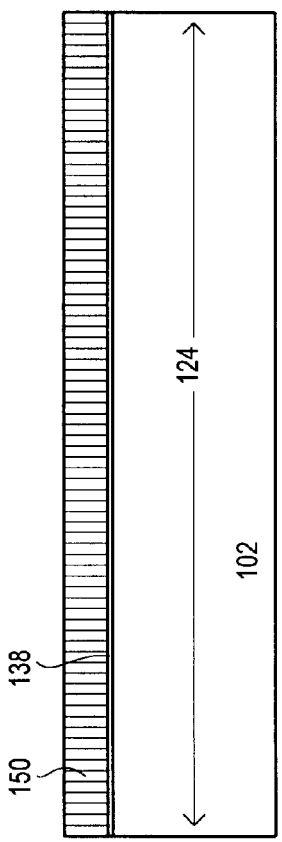
Figure 4B:
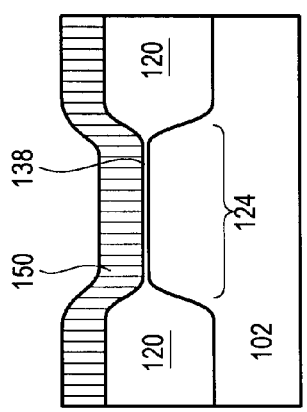
Figure 5A:
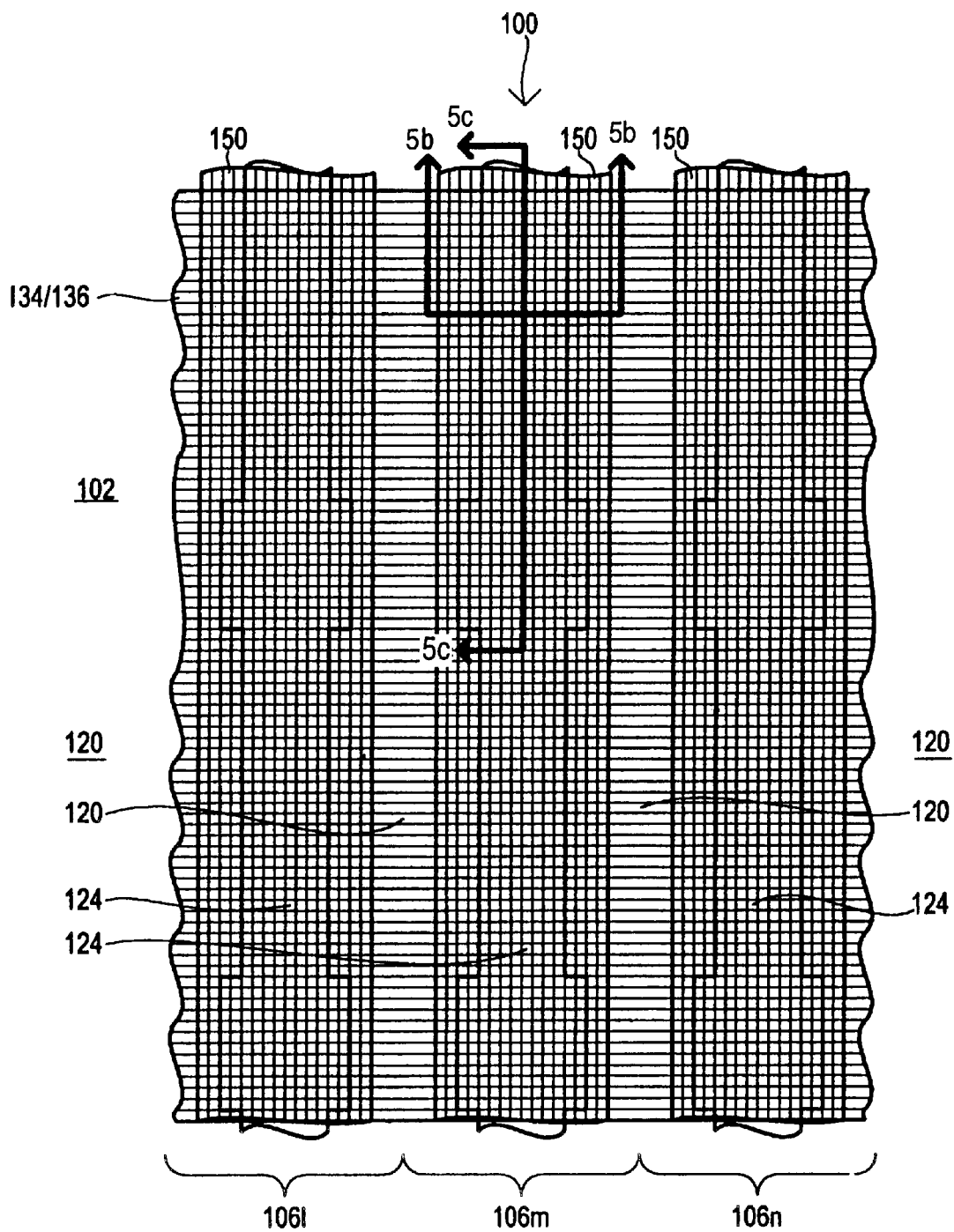
Figure 5C:
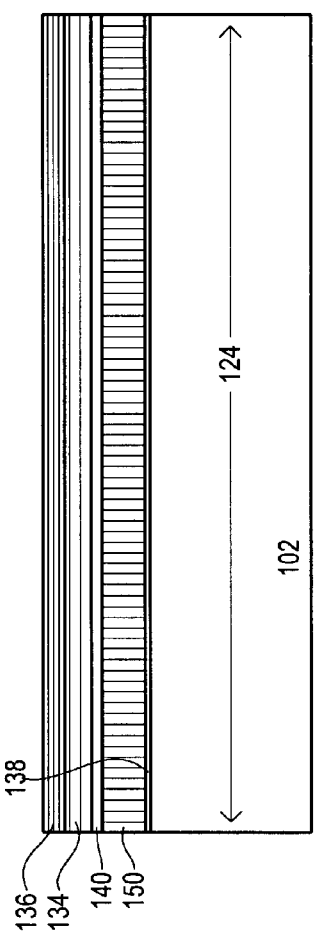
Figure 5B:
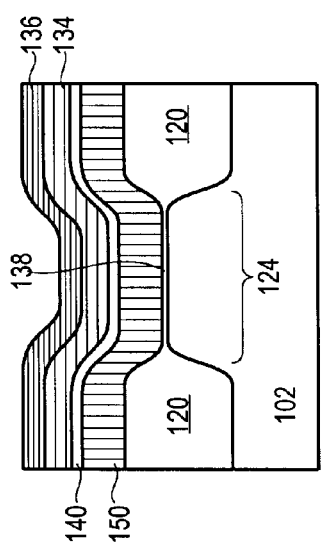

Referring now to FIGS. 4a–4c, following the growth of the tunnel dielectric 138, a first layer of polysilicon (poly 1) is deposited (step 210). The poly 1 layer conformally covers tunnel dielectric 138 and the isolation regions 120. In the preferred embodiment, the poly 1 layer is deposited using a conventional polysilicon deposition process resulting in amorphous or polycrystalline grain structures. Doping of the poly 1 can be done in situ, or by using ion implantation. Typical deposition temperatures are ~570° C. for amorphous silicon, and ~630° C. for polycrystalline silicon. An in situ doping technique using phosphoryl trichloride ($POCl_3$), or ion implant may be used to dope the poly 1 layer. For ion implantation, typical phosphorous implant doses are approximately $5 \times 10^{15}/cm^2$ at an energy of 30 KeV. The resulting preferred vertical thickness of the poly 1 layer is approximately 500–1500 Å. Step 212 of FIG. 10, involves patterning a first floating gate structure, referred to in this description as a floating gate "slab." In the preferred embodiment, this step includes the etching of the poly 1 layer. A poly 1 etch mask of photoresist is developed along the channel length of the EPROM cell to pattern the floating gate as in a conventional 1-T cell flash EPROM process. The poly 1 is subjected to an etch which etches through the poly 1 down to the field oxide 120 creating floating gate "slab" 150 structures that cover the memory cell channel regions. Three such floating gate slabs 150 are set forth in FIG. 4a. As set forth in FIGS. 4b and 4c, the floating gate slabs 150 preserve the tunnel dielectric 138 and provide the required coupling for cell programming to word lines. In the preferred embodiment, an anisotropic reactive ion etch step is used to etch through the poly 1. The poly 1 etch mask is subsequently stripped.

The process 200 continues with the creation of an interpoly dielectric 140 (step 214). The interpoly dielectric 140 covers the exposed areas of the floating gate slabs 150. As previously described, in the preferred embodiment, the interpoly dielectric layer is a composite layer of ONO. This layer is produced by a first oxidation step which oxidizes the exposed floating gate slabs 150 surfaces following the poly 1 etch (step 212). A layer of silicon nitride is then deposited. The silicon nitride is subsequently oxidized to produce another layer of silicon dioxide. In the preferred embodiment, the bottom oxide layer has a thickness in the range of 50–150 Å, and is formed by a dry oxidation at ~1000° C. The middle nitride layer is formed by conventional silicon nitride deposition techniques. In the preferred embodiment the initial thickness of the nitride layer is in the range of 75–150 Å. Oxidation of the nitride is a wet oxidation at a temperature of approximately 950° C. The resulting top oxide layer has a thickness in the range of 20–50 Å. A high pressure oxidation can also be used to obtain a thicker top oxide layer greater than 50 Å. Referring once again to FIG. 10, following step 214, the entire flash EPROM cell array is covered by an array protect mask (step 216). With the array protected from etch steps, initial gate areas for peripheral transistor structures are formed by etching channel regions, and growing gate oxide for MOS transistor devices peripheral to the flash EPROM cell array. Once the intergate dielectric is formed, the second layer of polysilicon (poly 2) 134 is deposited (step 218). The poly 2 layer 134 conformally covers the interpoly dielectric 140, and so follows the general shape of the floating gate slab 150. In the preferred embodiment, the poly 2 layer has a thickness of approximately 1k–2kÅ. The layer has a polycrystalline grain structure and is deposited at a temperature of approximately ~630° C. Doping is achieved either by in situ doping, or by ion implantation in the same manner as the poly 1 layer. In the preferred embodiment, following the deposition of the poly 2 layer, the layer of silicide 136 is formed. According to well understood techniques, a layer of tungsten silicide is formed over the poly 2 layer to create a $WSi_2$/poly 2 layer. In the preferred embodiment, the silicide is deposited by chemical vapor deposition for a thickness of approximately 1000–1500 Å. The flash EPROM array following this step is set forth in FIGS. 5a–5c. To prevent the silicide from lifting off in subsequent process steps, a layer of oxide, having a thickness of approximately 500 Å formed from tetraethylorthosilicate (TEOS), is deposited over the stacked gate. An insulating cap layer 146 is then formed over the silicide 136/poly 2 134 layer. The insulating cap layer 146 can be formed from TEOS for a total thickness of 1,000 Å. Alternatively, the insulating cap layer 146 can be a 500 Å layer of CVD nitride.

Referring once again to FIG. 10, the process continues with a stacked gate etch step (step 220). A stacked gate etch mask of photoresist is formed over the insulating cap layer. The stacked gate etch mask defines the word lines of the array, and runs in strips, also defining the memory cell channel lengths. Once the stacked gate etch mask is formed, an anisotropic stacked gate etch is applied. The stacked gate etch etches through the exposed portions of the silicide 136/poly 2 134 layer and the floating gate slabs 150, down to the field oxide 120 (or tunnel dielectric 138 in the event the active area 124 is underneath). The etching of the floating gate slabs 150 by the stacked gate etch creates the floating gates 110. The etching of the silicide 128/poly 2 126 layer results in the overlying wordlines 112 (control gates). Following the array stacked gate etch, periphery gates are etched using a periphery gate mask and etch. Following the stacked gate etch (step 220) and periphery gate etch, thin protective sidewall spacers are formed on the stacked gate by depositing a layer of oxide using TEOS, and subsequently etching the oxide layer back with an anisotropic etch. The stacked gate structures are then oxidized to surround the floating gates with a good quality thermal oxide. It is noted that the floating gate is oxidized through the TEOS sidewalls.

The array is then subjected to a source implant (step 222) followed by a drain implant (step 224). In the preferred embodiment, a source implant mask is formed over the array that leaves the source regions exposed. Two source implants are then performed. Arsenic (As) is implanted at an approximate concentration and energy of $8 \times 10^{15}/cm^2$ and 50 KeV, respectively, and phosphorous is implanted at an approximate concentration and energy of $1 \times 10^{14}/cm^2$ and 100 KeV, respectively. Tilt source implant may be used as set forth in U.S. Pat. No. 5,518,942 issued to Ritu Shrivastava one May 21, 1996. Following the source implant, the source mask is removed and a drain mask is formed over the array which leaves the drain regions exposed. The drain is then implanted with two implants. One implant is of As at an approximate concentration and energy of $3 \times 10^{15}/cm^2$ and 60 KeV, respectively. Another implant is of boron at an approximate concentration and energy of $4 \times 10^{13}/cm^2$ and 80 KeV, respectively. Tilt implant may be used again in the formation of the drain. The flash EPROM device is then subjected to an anneal step, according to well understood techniques, to anneal any implant damage and allow for some diffusion of the dopants.

Figure 6A:
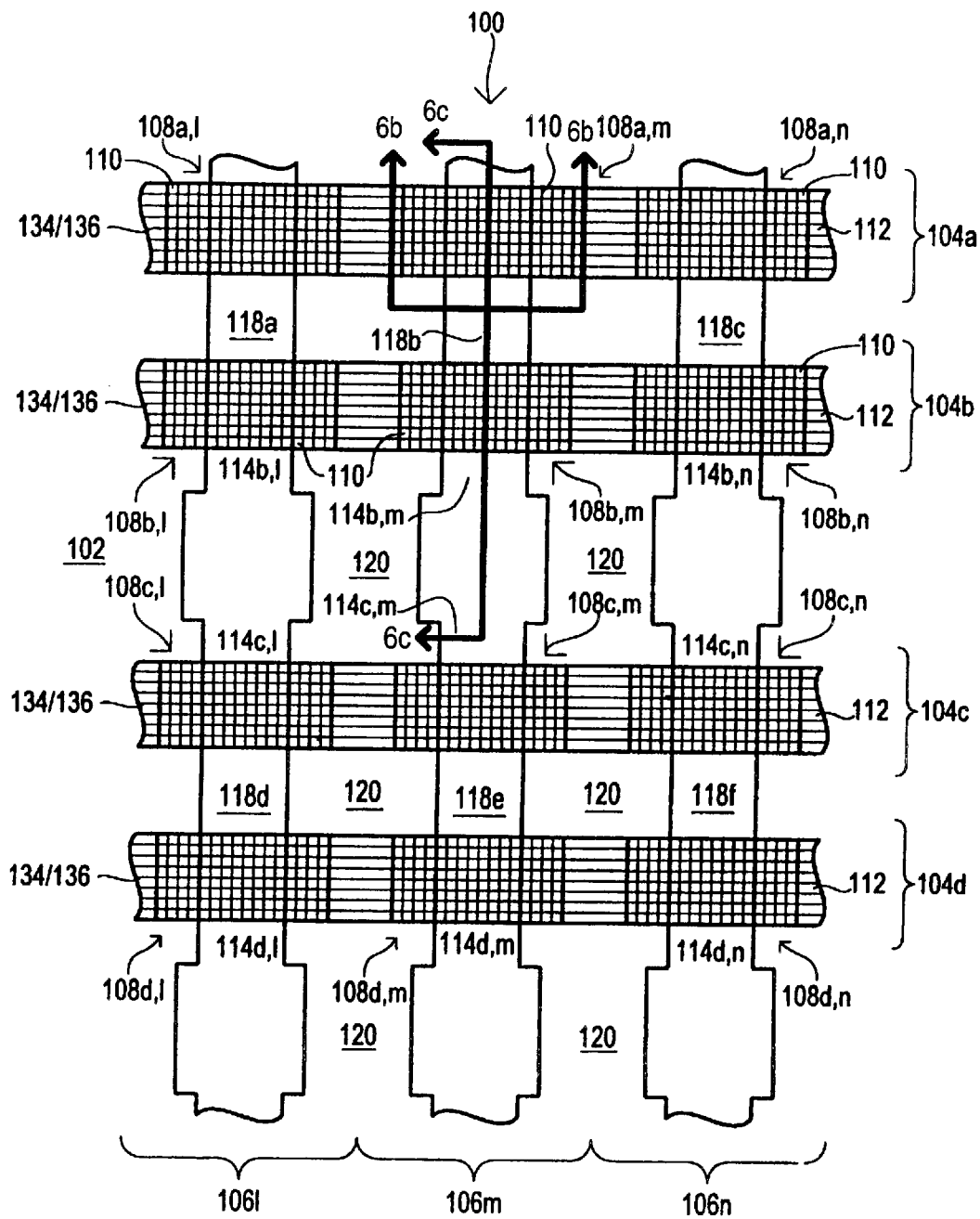
Figure 6C:
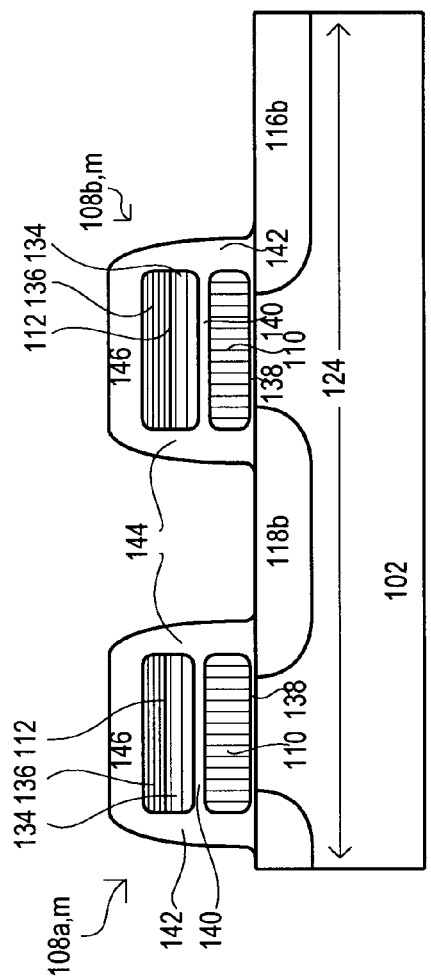
Figure 6B:
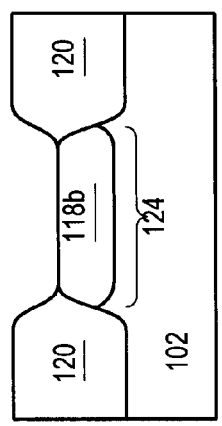

A sidewall dielectric is then deposited (step 226) and etched back (step 228) using conventional techniques to form source sidewall spacers 144 and drain sidewall spacers 142. The flash EPROM array following these steps is set forth in FIGS. 6a–6c. As set forth in FIG. 6a, the source and drain implants (steps 222 and 224) result in the formation of the drain regions (114b,l–114d,n) and source regions (118a–118f), which in turn, completes the formation of the memory cell (108a,l–108d,n) structures.

Figure 7A:
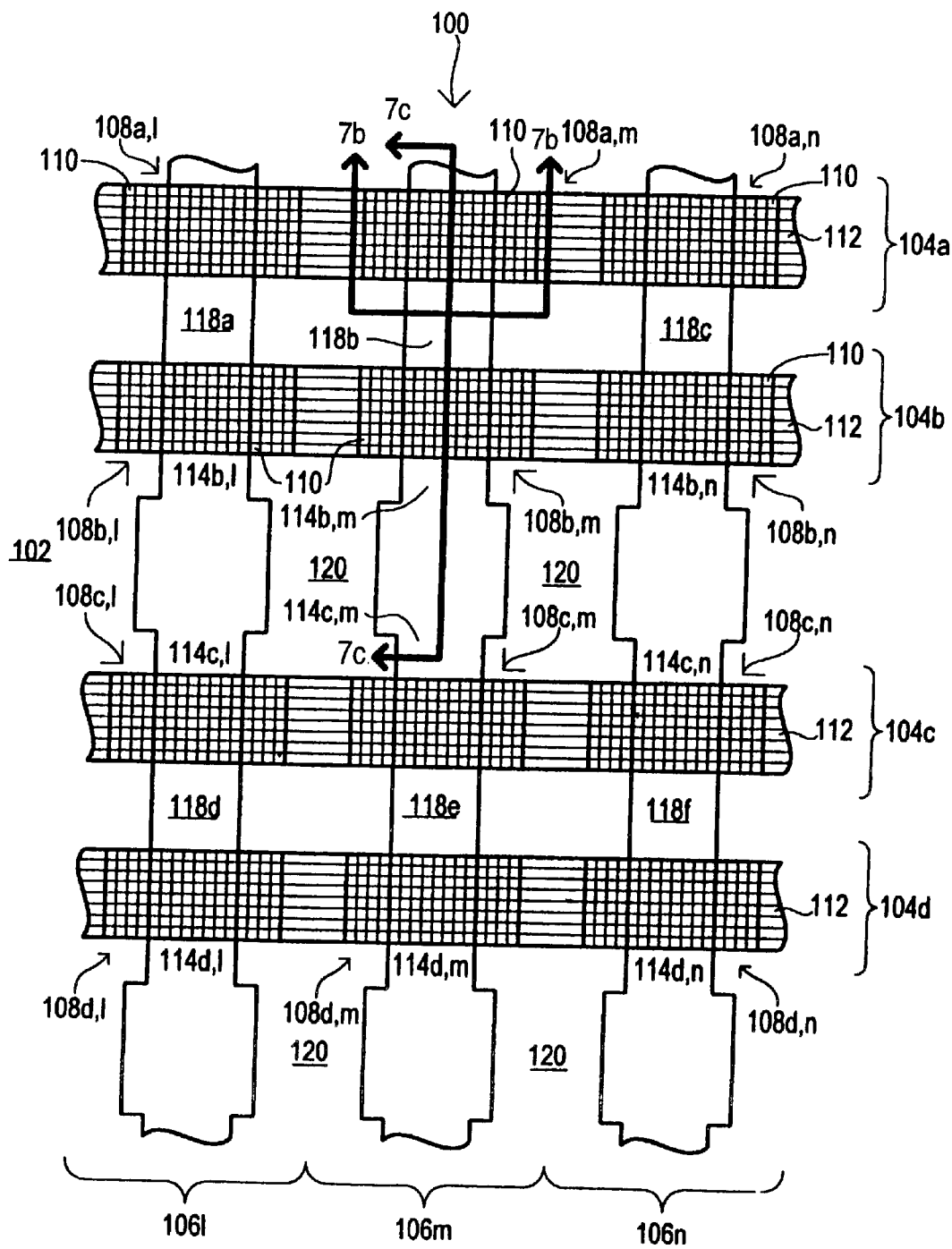
Figure 7C:
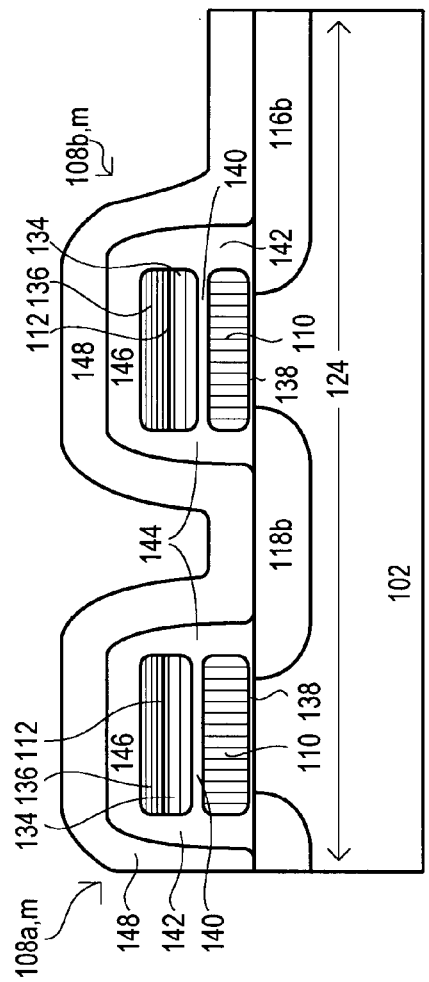
Figure 7B:
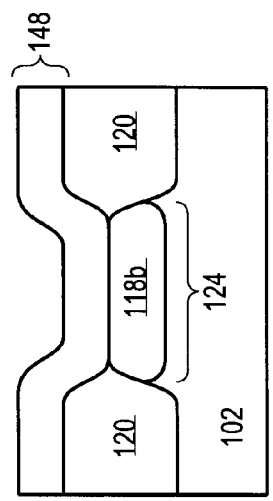

Referring now to FIG. 10 in conjunction with FIGS. 7a–7c, the process continues with a first interlayer dielectric (ILD 1) deposition (step 230). The ILD 1 148 conformally covers the memory cells (108a,l–108d,n), including the drain regions (114b,l–114d,n) and source regions (118a–118f). In the preferred embodiment, the ILD 1 is silicon oxide deposited using conventional techniques with TEOS. The thickness of the ILD 1 is approximately 2,000 Å.

Figure 8A:
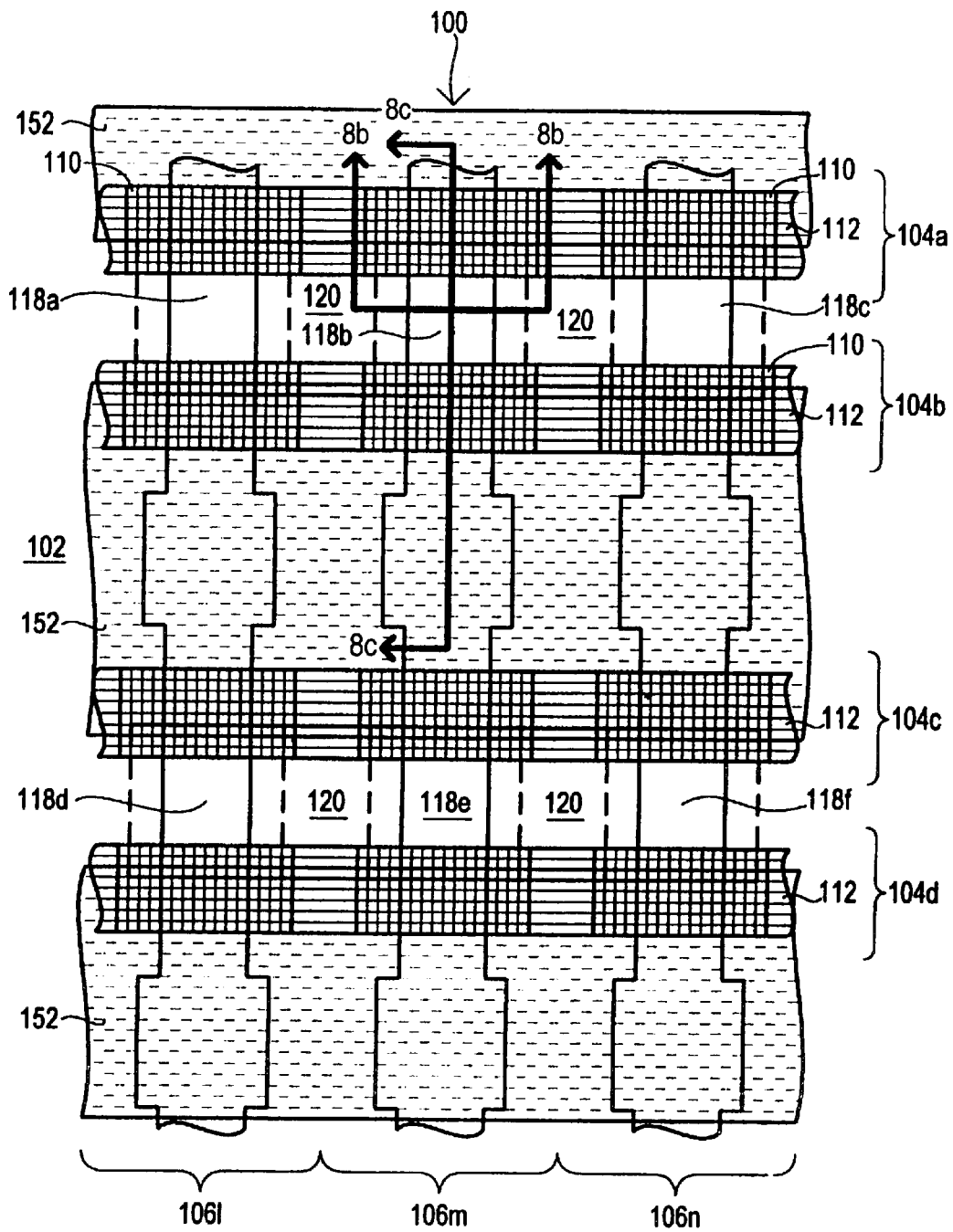
Figure 8C:
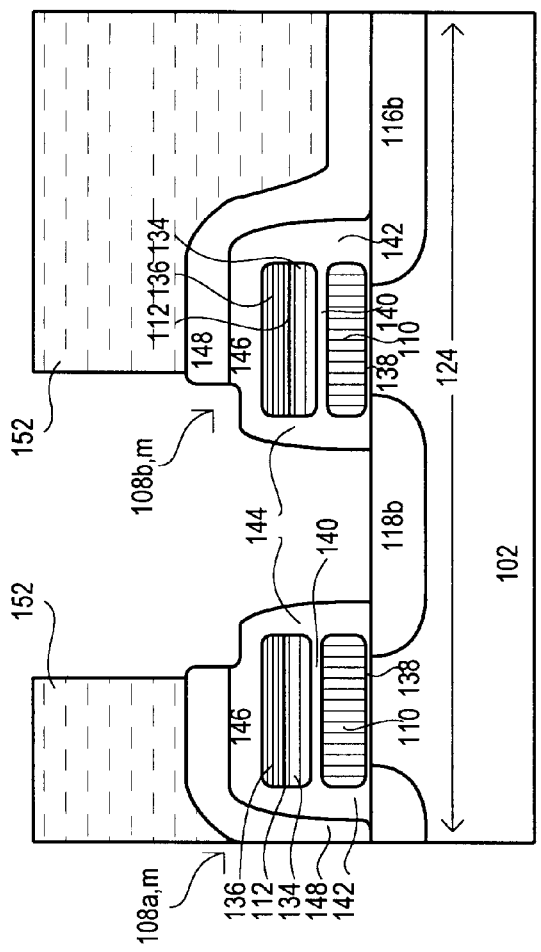
Figure 8B:
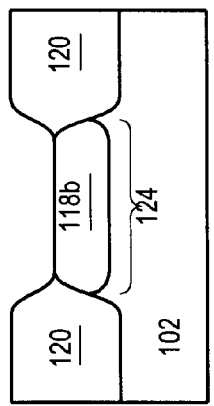
Figure 9A:
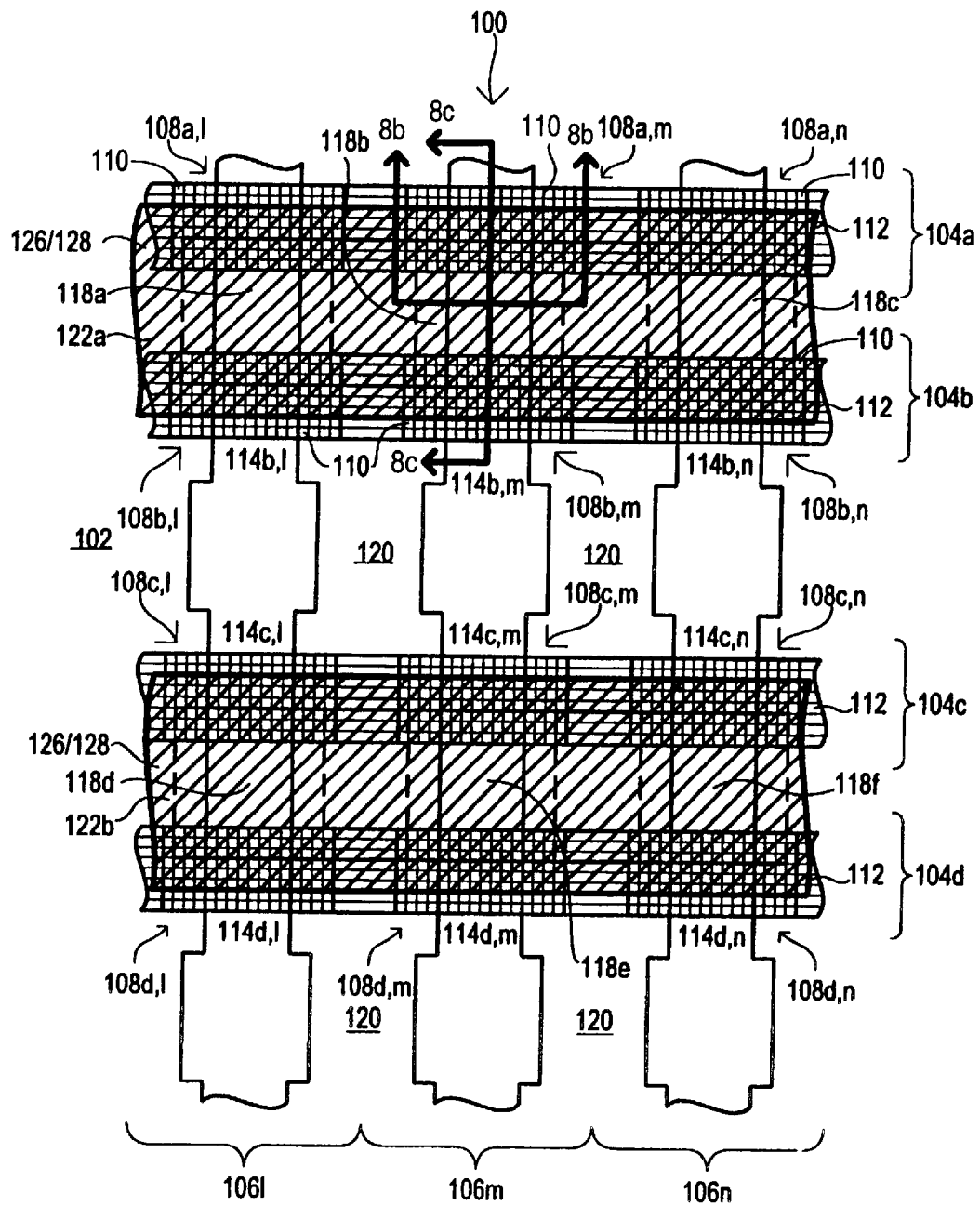
Figure 9C:
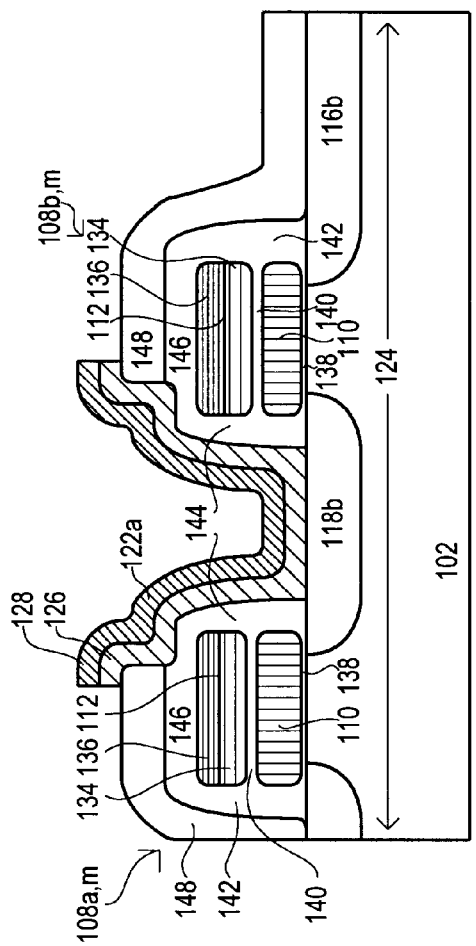
Figure 9B:
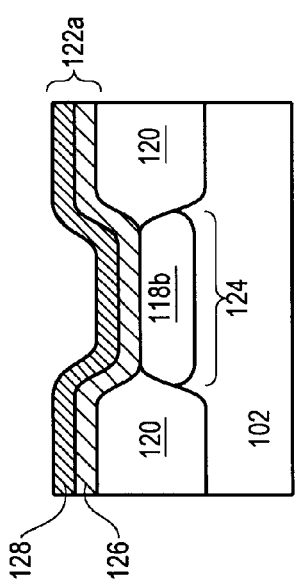

The preferred embodiment of the present invention diverges from prior art approaches in the etching of the self-aligned source contact. As shown in FIG. 10, a self-aligned source contact etch (step 232) is applied to the array to clear the source regions (118a–118f). A source etch mask 152 is formed over the flash EPROM array that exposes the source regions. In the preferred embodiment, the source etch mask 152 exposes the source regions (118a–118f) along with portions of the isolation regions 120 between adjacent source regions. Further, because the source contact is self-aligned, the source etch mask 152 also exposes the source sidewall spacers 144 and a portion of the cap insulators 146. Also note that this opening can overlay the stacked gate without introducing any problems. A source etch is then applied. Unlike the self-aligned common source approach of FIGS. 1b and 1c, the source etch does not etch through the portions of the field oxide regions 120 that separate adjacent source regions. Instead, the source etch clears the ILD 1 148 over the source regions to expose the source regions, leaving the intermediate field oxide regions 120 in-tact. This results in minimal etching of the isolation regions 120, but more importantly, results in far less reduction of the thickness of the source sidewall spacers 144 than the noted prior art self-aligned common source case of FIGS. 1b and 1c. The flash EPROM array following the source contact etch is set forth in FIGS. 8a–8c. In an alternate embodiment, the source etch mask exposes only those areas proximate the source regions, rather than an entire horizontal swath. The extents of the this alternate source etch mask are represented by the dashed line in FIG. 8a.

Once the source regions (118a–118f) have been cleared by the source contact etch (step 232), a third layer of polysilicon (poly 3) 126 is deposited (step 234) to form self-aligned contacts with the source regions (118a–118f). A layer of silicide 128 is then formed over the poly 3 126 (step 236). The poly 3 126/silicide 128 layer is then patterned (step 238) to clear areas between the rows to allow for bit line contacts, while maintaining a conductive connection between multiple source regions (118a–118f). In the preferred embodiment, the poly 3 126/silicide 128 layer is patterned into source conductor members 122a–122b which are disposed in the row directions, over the source regions shared by adjacent rows. It is noted that the silicide 128 reduces the resistance between the commonly connected sources. Further, the diffused source region area is much smaller than that of the prior art approaches in FIGS. 1a–1c, resulting in less substrate leakage. Also, due to the silicided poly 3, the source resistance can be made much smaller than the case of conventional source diffusions. The EPROM array following the poly 3 126/silicide 128 etch is set forth in FIGS. 9a–9c. As set forth in FIG. 9b, in the row direction along the source regions, the poly 3 126/silicide 128 layer is disposed over the isolation regions 120 and extends to make contact with the source regions. As set forth in FIG. 9a, the source conductor member 122a extends between the wordline 112/floating gate 110 pairs, to make contact with the source region 118b. The source sidewall spacers 144 and insulator caps 146 insulate the wordlines 112 and floating gates 110 from the source conductor member 122a, in a self-aligned contact arrangement. The relatively wide source conductor members 122a–122b allow for more flexibility in the event a via is dropped to the source conductor members 122a–122b from a higher level of interconnect such as metal. Further, such a via would consume no substrate area, unlike the self-aligned common source arrangement set forth in FIGS. 1b and 1c. In the preferred embodiment, the poly 3 is deposited and doped using conventional chemical vapor deposition techniques for a thickness of approximately 1,000 Å. The silicide is tungsten silicide, and is deposited by chemical vapor deposition for a thickness of approximately 1,000 Å.

Once the source conductor members 122a–122b have been formed, a second interlayer dielectric (ILD 2) 130 is deposited over the flash EPROM array. In the preferred embodiment, the ILD 2 is formed using boron and phosphorous doped TEOS (BPTEOS), or alternately, conventional borophososilicate glass (BPSG) is used. The thickness of this ILD is approximately 4,000 Åafter reflow and/or planarization using chemical mechanical polishing (CMP) techniques. Bit line contacts (116a–116f) are then formed (step 242) by etching through the ILD 1 148 and ILD 2 130 to the active areas between the drain regions of the rows. A first layer of metallization (metal 1) is then deposited to make contact with the bit line contacts (116a–116f) (step 244). The metal 1 is then patterned according to conventional techniques (step 246) to form bit lines 132 as set forth in FIGS. 2a–2c. In the preferred embodiment, a tungsten "plug" is formed, using tungsten deposition and etch back techniques, to make bit line contacts with the drain regions. The process concludes with conventional EPROM processing techniques (step 248) to arrive at a flash EPROM device. Such techniques can include more layers of metal interconnects, if needed.

Unlike prior art flash EPROM architectures, the present invention provides an EPROM array having very low resistance source lines running in the row direction. For example, the sheet resistance of the source interconnect can be reduced from about 80 Ω/ to 8 Ω/ using the present invention. As a result the number of metal "straps" required to provide a reference voltage to the source lines can be eliminated or reduced, freeing up area in the array.

The architecture of the present invention also allows the array to be broken into customizable groups of one or more rows by source decoding. In this manner, a user may selectively erase various sectors of arbitrary sizes (i.e., programmable erase granularity). For example, in prior art approaches, to erase selected rows in a given common source region (or "sector") the entire common source region (i.e., all the sources in the sector) would be driven to a source erase voltage (a positive voltage, for example) while selected wordlines (those rows that are to be erased) were driven to a wordline erase voltage (a relatively large negative voltage, for example). Those rows within the sector that were not be erased would have wordlines driven to wordline de-select voltage, but would still have their sources driven to the source erase voltage. In contrast, by using decoded sources, the present architecture allows the wordlines and sources of only those rows that are to be erased, to be driven to the wordline erase voltage and source erase voltage, respectively. The number of rows that may be erased in this manner is not limited to a certain minimum number due to a common source diffusion, but can be determined by a user of the flash EPROM device. Such an architecture provides the selectable erase advantages of conventional EEPROMs with the rapid erase advantages of conventional flash EPROMs. Providing this new flexibility can also improve reliability by better control of erase, and erase convergence techniques.

Figure 11:
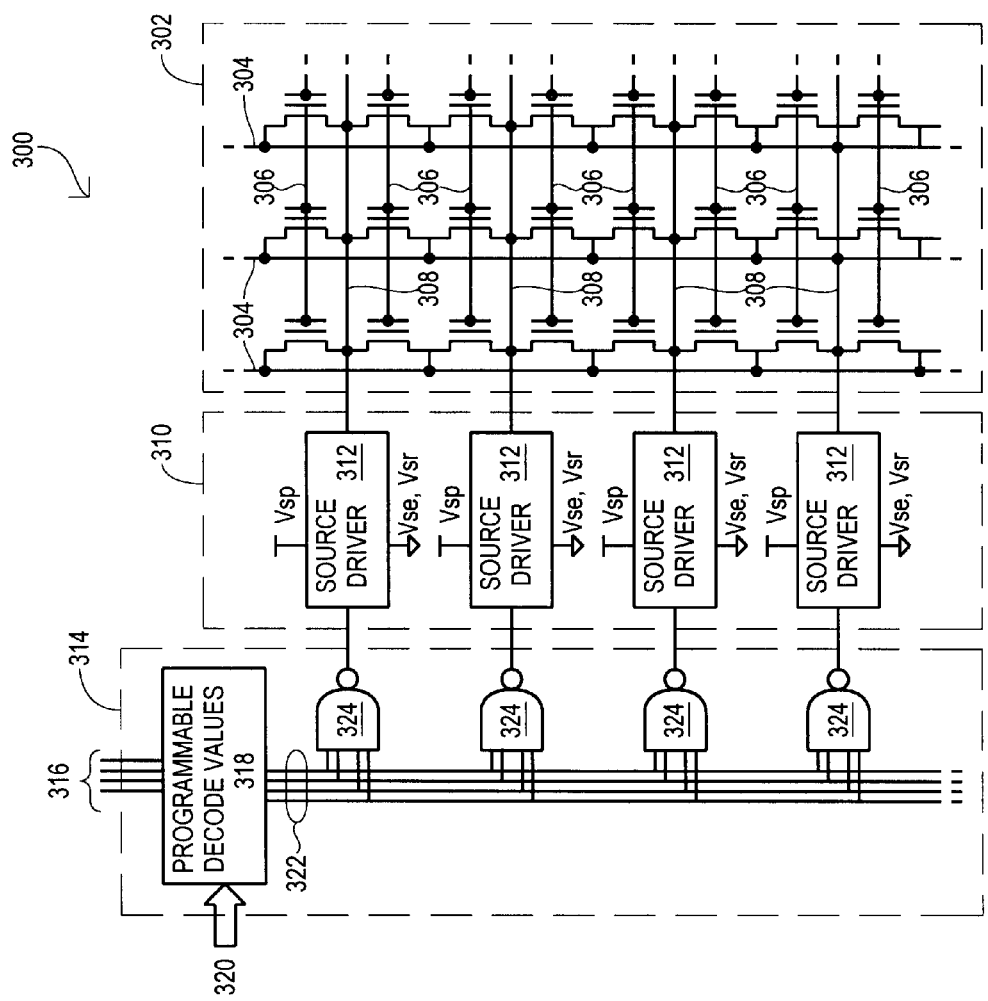
FIG. 11 is a block schematic diagram illustrating a source decoding scheme according to the present invention.

FIG. 11 sets forth a block schematic diagram illustrating a source decoding scheme for a flash EPROM according to the present invention. The flash EPROM is designated by the general reference character 300, and includes an array of 1-T memory cells 302 arranged in rows and columns. The memory cell in the array 302 are commonly coupled by their respective drains to bit lines 304 along the column direction (the vertical direction in FIG. 11). The control gates of the memory cells of the array 302 are commonly coupled word lines 306 in the row direction (the horizontal direction in FIG. 11). The sources of the memory cells of the array 302 are commonly coupled source lines 308 which, in the embodiment of FIG. 11, are disposed in the row direction. It is further noted that the source lines 308 in FIG. 11 are shared by two adjacent rows of memory cells.

Referring once again to FIG. 11, the source lines 308 are each coupled to, and driven by, a source driver section 312. The source driver section 312 includes a source driver circuit 312 coupled to each source line 308. It is understood that alternate embodiments could include source drivers coupled to multiple source lines. Each source driver circuit 312 receives an input signal from a source decoding section 314, and in response to the input signal, drives its respective source line 308 to a source programming voltage (Vsp), a source erase voltage (Vse) or a source read voltage (Vsr) depending upon the current operating mode of the flash EPROM 300.

The source decoding section 314 is shown to receive a number of address predecode signals 316. According to well understood techniques, address predecode signals 316 are generated from externally applied address signals. In the preferred embodiment, the address predecode signals 316 are the same as those used to drive word line drivers (i.e., are row predecode signals). The address predecode signals 316 are received by a programmable decode value circuit 318, which also receives user input values 320. The programmable decode value circuit 318 provides a number of source decode signals 322 based upon the address predecode signals 316 and the user input values 320. In the particular embodiment of FIG. 11, the source decode signals 322 generally follow the address predecode signals 316 unless altered in response to the user input values 320, which can force certain source decode signals 322 to a predetermined logic state, regardless of values of the address predecode signals 316. For example, if the user input values indicate no alteration source decode signals, the programmable decode value circuit 318 is essentially transparent in operation, allowing the predecode signals 316 to drive a given source decoder 324. In such a case the memory cell of the array 302 could be erased in groups of two rows only. Alternately, the user input values 320 could dictate a larger logical grouping of source line 308, to allow for the simultaneous erasure of multiple row pairs. Finally, the user input values 320 could indicate entire sector or array erase, in which case the address decode values would have no effect on the source decode signals 322, and the source decoder signals 324 would all be driven at the same time for a standard sector/array flash erase operation.

It is understood that while FIG. 11 sets forth only four address predecode signals 316 one skilled in the art could arrive at equivalent structures utilizing fewer or greater numbers of address predecode signals. Further, one source decoder 324 could drive multiple source drivers 312. It is also noted that the source decode signals 312 could be generated entirely from the user input values 320, allowing the source lines 308 of memory cell array 302 to be logically divided by groups of rows, into arbitrary fractional (½") portions of the array, where the value n is provided by user input values 320.

The user input values 320 could be provided the flash EPROM 300 by way circuits altered via laser fusible links. Non-volatile memory cells could also be employed to store the user values.

By greatly reducing the role of substrate resistance in the common source arrangement, source voltage drops are reduced improving the uniformity of programming and erase speeds. This also improves cell endurance, by reducing the need to reprogram or correct for over-erasure.

The source arrangement also provides better low supply voltage operation by reducing the source voltage drops. In addition, programming and erase cell current variations are reduced by eliminating the need for periodic source straps which disrupt the periodic cell layout structure. It is understood that the embodiment set forth herein are only some of the possible embodiments of the present invention, and that the invention may be changed, and other embodiments derived, without departing from the spirit and scope of the invention. Accordingly, the invention is intended to be limited only by the appended claims.

What is claimed is:

1. A non-volatile memory array, comprising:
    a plurality of memory cells formed in a semiconductor substrate and arranged in rows and columns in said substrate, each memory cell including a drain region, a source region, a channel region disposed between the drain region and the source region, a floating gate disposed over at least the channel region, and a control gate disposed over the floating gate, and wherein the source regions of memory cells in adjacent columns of said array are electrically isolated by dielectric isolation regions formed in said substrate; and
    for each row of memory cells of said array, a conductive member disposed along at least a portion of said row, said conductive member making electrical contact with the source regions of the memory cells of the portion of said row, said conductive member being self-aligned with the memory cells of said portion of said row.

2. The non-volatile memory array of claim 1, and wherein:
    said plurality of memory cells includes a first row of memory cells and a second row of memory cells adjacent to the first row, each of the memory cells along a portion of the first row sharing a common source region with at least one memory cell of the second row; and wherein
    said conductive member is disposed along at least a portion of the first and second rows, said conductive member making electrical contact with the common source regions of the memory cells in said portion of the first and second rows, the contact of said conductive member being self-aligned with the memory cells of said portion of the first and second rows.

3. The non-volatile memory array of claim 1, and wherein:
    said plurality of memory cells includes a plurality of row pairs, at least a portion of the memory cells in each row pair having common source regions; and
    a conductive member associated with each row pair, each conductive member being disposed along said portion of its respective row pair and making electrical contact with the common source regions thereof, the contact of each conductive member being self-aligned with the memory cells of said portion of its respective row pair.

4. The non-volatile memory array of claim 1, and wherein:
    said memory cells are arranged in a plurality of rows, the control gates of the memory cells in each row being commonly coupled to a corresponding word line that extends generally parallel to the row; and
    a conductive member associated with at least one row of memory cells, each conductive member being disposed generally parallel to the corresponding word line along at least a portion of its respective row of memory cells and making electrical contact with the source regions thereof, the contact of each conductive member being self-aligned with the memory cells of said portion of its respective row.

5. The non-volatile memory array of claim 4, and wherein:
    each said conductive member overlaps the word line of its corresponding row along at least said portion of its corresponding row.

6. The non-volatile memory array of claim 4, and wherein:

the plurality of rows includes pairs of adjacent rows, at least a portion of the memory cells of the pairs of adjacent rows sharing common source regions; and wherein each said conductive member is associated with a pair of adjacent rows, and is disposed generally parallel to the word lines of its respective pair of adjacent rows along at least a portion of its pair of adjacent rows and makes electrical contact with the common source regions thereof, each said conductive member overlapping the word lines of its associated pair of adjacent rows along at least said portion of its respective pair of adjacent rows.

7. The non-volatile memory array of claim 1, and wherein:

said conductive member includes polysilicon.

8. The non-volatile memory array of claim 7, and wherein:

said conductive member includes a metal silicide.

9. The non-volatile memory array of claim 7, and wherein:

said conductive member includes a metal.

10. The nonvolatile memory array of claim 1, and including:

a plurality of conductive members; and a source decoder and driving circuit coupled to said conductive members to drive selected conductive members to an erase voltage in response to a plurality of source decode signals.

11. The non-volatile memory array of claim 10, and wherein:

the plurality of source code signals are generated in response to at least one memory address signal.

12. The non-volatile memory array of claim 10, and wherein:

the plurality of source decode signals are generated in response to at least one user determined value.

13. In a flash EPROM memory device formed on a semiconductor substrate, an array configuration comprising:

a plurality of flash EPROM cells arranged in a plurality of rows extending in a row direction and a plurality of columns extending in a column direction; and a plurality of source connecting members extending in the row direction, each of said source connecting members disposed over and making electrical contact with source regions of memory cells of adjacent pairs of rows, the source regions of memory cells in adjacent columns of said array being electrically isolated by dielectric isolations regions formed in the semiconductor substrate; and each of said source connecting members enabling the selective erasing of the memory cells of one or both of the corresponding rows during an operation.

14. The array configuration of claim 13, and wherein:

said source connecting members enable the selective erasing of the memory cells of one or more of the row pairs during and erase operation.

15. The array configuration of claim 13, and including:

a plurality of bit line contacts formed along at least one row of the array, opposite to said source connecting members.

16. The array configuration of claim 13, and including:

said source connecting members being double diffused.

17. The array configuration of claim 13, and wherein:

each flash EPROM cell includes a floating gate, the array further including a plurality of word lines each disposed along at least one of the rows, over and insulated from the floating gates of the row; and said plurality of source connecting members are self-aligned with the said word lines and the floating gates of the rows.

18. The array configuration of claim 13, and comprising:

a plurality of source driver means for coupling at least one source connecting member to an erase voltage in response to a driver input signal; and a source decoder means for generating at least one driver input signal in response to the source decode signals.

19. The array configuration of claim 18, and including:

address dependent source decode signal generating means responsive to a plurality of memory address signals for generating the source decode signals.

20. The array configuration of claim 18, and including:

user dependent source decode signal generating means responsive to a plurality of predefined user values for generating the source decode signals.

21. The array configuration of claim 18, and including:

configurable source decode signal generating means responsive to a plurality of predefined user values and memory address values for generating the source decode signals.

22. A non-volatile memory array formed in a semiconductor substrate, comprising:

a plurality of memory cells arranged in at least a first row of memory cells and a second row of memory cells adjacent to the first row, thereby forming adjacent columns of memory cells, each of the memory cells along a portion of the first row sharing a common source region with at least one memory cell of the second row; and a conductive member being disposed along at least a portion of the first and second rows, said conductive member being associated with the first and second rows and making electrical contact with the common source regions of the memory cells in said portion of the rows, the contact of said conductive member being self-aligned with the memory cells of said portion of the rows, and wherein said conductive member enables the selection of the one of the first or second rows during an erase operation, and wherein the source regions of adjacent columns of memory cells are electrically isolated by dielectric isolation regions formed in the semiconductor substrate.

23. The non-volatile memory array of claim 22, and wherein each of said memory cells includes a drain region, a source region, a channel region disposed between the drain region and the source region, a floating gate disposed over at least the channel region, and a control gate disposed over the floating gates, the control gates of the memory cell in each row being commonly coupled to a word line extending generally parallel to the row, the conductive member being disposed generally parallel to the word line along at least portion of its respective row.

24. The non-volatile memory array of claim 22, and wherein said conductive member includes polysilicon.

25. The non-volatile memory array of claim 24, and wherein said conductive member includes a metal silicide.

26. The non-volatile memory array of claim 24, and wherein said conductive member includes a metal.

* * * * *